(12) United States Patent
Yuan

(10) Patent No.: US 7,514,995 B2
(45) Date of Patent: Apr. 7, 2009

(54) STANDBY AND CONCURRING SYSTEM OF A POWER AMPLIFIER AND METHOD FOR POWER AMPLIFYING

(75) Inventor: Wenxin Yuan, Guangdong (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 132 days.

(21) Appl. No.: 11/608,484

(22) Filed: Dec. 8, 2006

(65) Prior Publication Data

US 2007/0139104 A1 Jun. 21, 2007

(30) Foreign Application Priority Data

Dec. 8, 2005 (CN) .................. 2005 1 0130296

(51) Int. Cl.
*H03F 3/68* (2006.01)
(52) U.S. Cl. ................... 330/124 R; 330/295
(58) Field of Classification Search ............ 330/124 R, 330/124 D, 295
See application file for complete search history.

(56) References Cited

U.S. PATENT DOCUMENTS

| | | | |
|---|---|---|---|
| 3,931,623 A | 1/1976 | Sones et al. | |
| 5,287,543 A * | 2/1994 | Wolkstein | 455/13.3 |
| 5,828,268 A * | 10/1998 | Ando et al. | 330/124 D |
| 6,094,097 A * | 7/2000 | Ke | 330/124 R |
| 6,292,677 B1 | 9/2001 | Hagen | |
| 2002/0097087 A1 | 7/2002 | Petz et al. | |
| 2004/0043750 A1 | 3/2004 | Kim | |

FOREIGN PATENT DOCUMENTS

| | | |
|---|---|---|
| CN | 1523907 A | 8/2004 |
| JP | 4314215 | 11/1992 |
| JP | 6296115 | 10/1994 |

OTHER PUBLICATIONS

Adams G et al: "A Pin Diode Antenna Switch that Doubles As a Combiner" Microwave Journal, Horizon House Publications, Norwood, MA, US, vol. 40, No. 10, Oct. 1997, p. 134, 136 138, XP000752934, ISSN: 0192-6225.

* cited by examiner

*Primary Examiner*—Henry K Choe (57) ABSTRACT

A power amplifier system including: M main power amplifiers and one standby power amplifier, where M is a positive integer; an input switching module, connected to the inputs of the M main power amplifiers and the standby power amplifier; an output switching module, connected to the outputs of the M main power amplifiers and the standby power amplifier. In the system, M groups of signals are inputted to the input switching module, processed by the power amplifiers, and then outputted from the output switching module. The standby power amplifier is independent and is capable of taking place of the faulted main power amplifier immediately without a shut down. In the system there is no correlation between the isolation of various signals and the consistency of the power amplifies, which leads to a substantial decrease of the requirement on consistency of the power amplifiers.

9 Claims, 4 Drawing Sheets

STANDBY AND CONCURRING SYSTEM OF A POWER AMPLIFIER AND METHOD FOR POWER AMPLIFYING

CROSS-REFERENCE TO RELATED APPLICATIONS

This application claims the benefit of Chinese Patent Application No. 200510130296.X filed on Dec. 8, 2005. The disclosure of the above application is incorporated herein by reference.

FIELD

The present disclosure relates to power amplifier technologies, and particularly, relates to a standby and concurring system of a power amplifier and a method for power amplifying.

BACKGROUND

The statements in this section merely provide background information related to the present disclosure and may not constitute prior art.

With the development of mobile communications, radio frequency power amplifiers are widely used in wireless access systems and microwave systems for signals amplifying, and become an important part of the systems. In a Code Division Multiple Access (CDMA) wireless access multi-carrier system, there is only one power amplifier in each sector. If the power amplifier of a sector goes wrong, the connection to the mobile terminals of the sector will fail. Therefore, the CDMA wireless access multi-carrier system puts a great emphasis upon the stability and reliability of the power amplifiers.

Power amplifiers may go wrong easily because of the high-current and high-voltage working conditions and the poor thermal environment. It is necessary to develop standby techniques for power amplifiers so as to improve the stability. The so-called standby refers to: there are two same power amplifiers in the system; in normal state, one of the two power amplifiers is a working power amplifier and the other is a standby power amplifier; when the working power amplifier goes wrong, the standby power amplifier will automatically switch to the working state to take on the operation of the faulted one without a power cut. Besides, a concurring technology is proposed to increase the output power of a power amplifier system, wherein two same power amplifiers in a parallel connection are inputted with the same signals, perform the same operations, and output the same signals, so as to increase the processing capability and output power of the power amplifier system.

Figure 1:
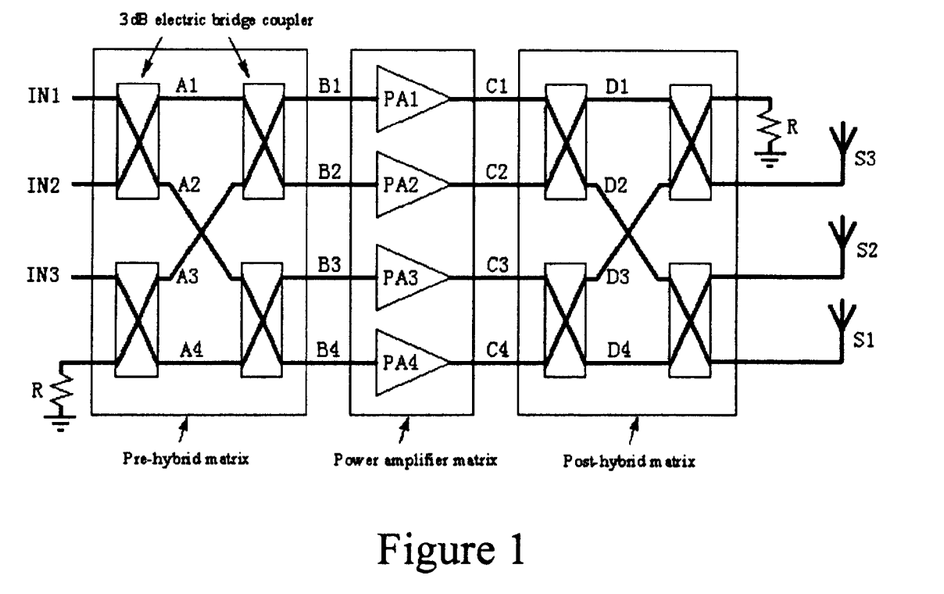
FIG. 1 is a schematic diagram of an existing standby and concurring power amplifier system in the prior art.

A standby and concurring solution of the power amplifier according to the prior art is shown in FIG. 1. According to FIG. 1, the system in the prior art includes a pre-hybrid matrix, a power amplifier matrix, a post-hybrid matrix, two matching resistors R and antennae S1, S2 and S3. The pre-hybrid matrix and the post-hybrid matrix both include four 3 dB electric bridges, respectively, with the pre-hybrid matrix providing a function of dividing signals and the post-hybrid matrix providing a function of combining signals. The power amplifier matrix includes four power amplifiers PA1, PA2, PA3, and PA4, each of which jointly amplifies the signals of the three sectors inputted from the inputs IN1, IN2, IN3 respectively. The transmission lines A1, A2, A3, A4 in FIG. 1 have the same length, so do transmission lines B1, B2, B3, B4, transmission lines C1, C2, C3, C4, and transmission lines D1, D2, D3, D4.

The input signal from IN1 is divided into 4 equal-amplitude signals after passing through the pre-hybrid matrix and then goes to the inputs of the four power amplifiers. Then the four signals are amplified by the power amplifier matrices respectively, combined to one signal by the post-hybrid matrix, and sent to the antenna S1 of sector 1. Depending on the phase superposition of the multiple signals, in an ideal situation, the input signal from IN1, after being divided, amplified and combined, will neither be outputted at the ports of antennae S2 and S3, nor appear on the matching resistor.

Likewise, the input signal from IN2 is outputted to the antenna S2 rather than S1, S3 or the matching resistor R after being divided by the pre-hybrid matrix, amplified by the power amplifier matrix and combined by the post-hybrid matrix; the input signal from IN3 is outputted to the antenna S3 rather than S1, S2 or the matching resistor R after being divided by the pre-hybrid matrix, amplified by the power amplifier matrix and combined by the post-hybrid matrix.

When any one of the power amplifiers in FIG. 1 goes wrong, the three remaining power amplifiers still work normally. The input signals from IN1, IN2, and IN3 can go to the antenna S1, S2, and S3, respectively, after being amplified by the system. Thus the mobile terminals of all the three sectors can access the system and it will not happen that no terminal in one sector is able to access the system.

While being combined by the post-hybrid matrix, the hybrid signal divided by the pre-hybrid matrix will be counteracted from the signals of other sectors depending on the differences in amplitude and phase among the signals, therefore, the requirement on the amplitude and phase of the signals is very strict in the system. If the amplitude relationship and the phase relationship among the signals can not meet the requirement, the signals will not be fully counteracted, thus leading to a cross-interference and a poorer isolation between the sectors. Such is a fatal defect of a power amplifier system.

The following factors will have an impact on the amplitude relationship and the phase relationship among the signals while the signals are divided and combined:

1. Factors in design or technology may make the coupling of the 3 dB electric bridge coupler not be the ideal 3 dB. Even an ideal 3 dB electric bridge coupler can meet the requirement of phase and amplitude simultaneously only at the center frequency, and it is theoretically impossible to simultaneously meet the requirements on amplitude and phase differences at a frequency departing from the center frequency.

2. If the four transmission lines A1, A2, A3 and A4 in the pre-hybrid matrix have different lengths, or the transmission lines B1, B2, B3 and B4 connecting the pre-hybrid matrix and the power amplifier matrix have different lengths, or the transmission lines C1, C2, C3, C4 connecting the power amplifier matrix and the post-hybrid matrix have different lengths, or the transmission lines D1, D2, D3, D4 in the post-hybrid matrix have different lengths, there will be an additional phase difference.

3. The dispersion characteristic mainly resulted from the gain and phase differences among the power amplifiers PA1, PA2, PA3, and PA4 calls for a strict matching among these power amplifiers. A typical requirement on gain difference is less than 0.5 dB while the requirement on phase difference is usually less than 10°.

All the above factors can lead to a poorer isolation between the sectors. With the ordinary technology, it is very difficult to achieve the sector isolation of 25 dB while the performance of 25 dB is unable to meet the protocol requirement of CDMA systems, as well as the requirement on the adjacent frequency interference in the case of special sector configurations. In other words, the requirement on signals isolation between adjacent sectors will not be met with the solution in the prior art.

In commercial applications of the solution according to the prior art, it is necessary to find another power amplifier having exactly the same characteristics of gain and phase as the replaced amplifier when a power amplifier should be replaced, which is very difficult.

SUMMARY

A power amplifier system with standby and concurring functions as well as a method for power amplifying is disclosed in embodiments of the present invention, and the technical solution is as follows:

A power amplifier system, includes:

M main power amplifiers, wherein M is a positive integer;

a standby power amplifier;

an input switching module, connecting to inputs of the M main power amplifiers and an input of the standby power amplifier, respectively; and an output switching module, connecting to outputs of the M main power amplifiers and an output of the standby power amplifier, respectively;

wherein, after being selected by the input switching module, M groups of signals are respectively inputted to one main power amplifier or the standby power amplifier and outputted by the output switching module.

After being selected by the input switching module, M-1 groups of signals are respectively inputted to one main power amplifier and outputted by the output switching module; the other group of signals are inputted to one main power amplifier and the standby amplifier and outputted by the output switching module.

A method for power amplifying, applied in a system including M main power amplifiers, one standby power amplifier, an input switching module respectively connecting to inputs of the M main power amplifiers and an input of the standby power amplifier, and an output switching module respectively connecting to outputs of the M main power amplifiers and an output of the standby power amplifier, wherein M is a positive integer, includes:

M groups of signals being respectively inputted to the M main power amplifier via the input switching module, and outputted by the output switching module after being respectively processed by the M main power amplifier;

when any first main power amplifier goes wrong, switching the input switching module and the output switching module;

the group of signals that are originally processed by the first main power amplifier being processed by the standby power amplifier.

As can be seen from the above solution, as a separate standby power amplifier is provided besides the main power amplifiers in the embodiments of the invention, when any one of the main power amplifiers goes wrong, the standby power amplifier can take place of the faulted main power amplifier immediately without a power cut or a shut-down; when any one of the main power amplifiers calls for concurring, the standby power amplifier can work together with the main power amplifier requiring concurring in parallel connection so as to increase the output power of the corresponding signal. Either the main power amplifier or the standby power amplifier amplifies just one group of signals, thus the isolation between groups of signals has nothing to do with the consistency of the power amplifier, which reduces the requirement upon consistency of the power amplifiers. Moreover, the isolation between groups of signals can be enhanced by increasing the number of levels of the switching components corresponding to the standby power amplifier, which further reduces the requirement on consistency of the power amplifiers. Therefore, in the embodiments of the present invention, even if the consistency of the power amplifiers is poor, the isolation between groups of signals will not be affected.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

A further description in detail is hereinafter given to this invention with reference to the accompanying drawings and embodiments.

Figure 5:
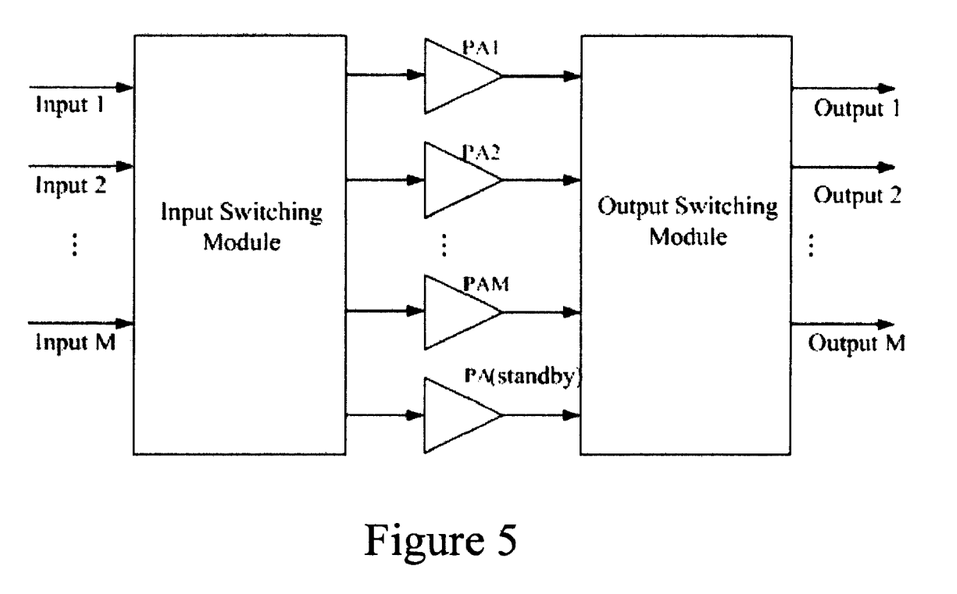
FIG. 5 is a schematic diagram of the structure of the power amplifier system in accordance with the embodiments of the present invention.

A power amplifier system in accordance with the embodiments of the present invention is illustrated in FIG. 5. As shown in FIG. 5, the power amplifier system includes: an input switching module, an output switching module, M main power amplifiers PA1, PA2 . . . PAM and a standby power amplifier PA, wherein M is a positive integer. In the system, the input switching module connects to the inputs of M main power amplifiers and the standby power amplifier, respectively; the output switching module connects to the outputs of M main power amplifiers and the standby power amplifier, respectively. M groups of signals will be inputted to the corresponding power amplifiers through the input switching module, then be amplified by the power amplifiers, and be outputted through the output switching module. The power amplifiers which are in charge of the amplification may be M main power amplifiers, or (M-1) main power amplifiers plus one standby power amplifier, or M main power amplifiers plus one standby power amplifier. The different combinations are related to different work states. The structure as well as the work state of the power amplifier system in accordance with the present invention is described in detail through the specific embodiments as follows.

The First Embodiment

Figure 2:
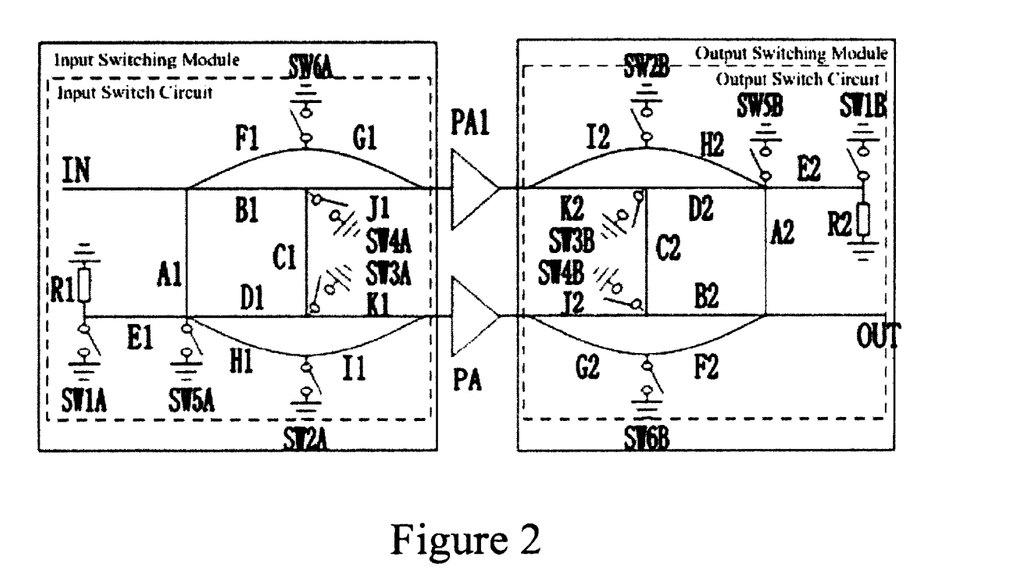
FIG. 2 is a schematic diagram of a 1+1 standby and concurring power amplifier system in accordance with a first embodiment of the present invention.

The implementation of the first embodiment of the invention is demonstrated with the 1+1 standby and concurring technology. '1+1' means that there are one main power amplifier and one standby power amplifier in the system. As shown in FIG. 2, the system includes a main power amplifier PA1, a standby power amplifier PA, an input switching module and an output switching module. Since there is only one main power amplifier, the input switching module includes one input switch circuit, and the output switching module includes one output switch circuit. The input switch circuit has the function of power distribution and microwave single-pole double-throw switch while the output switch circuit has the function of power combination and microwave single-pole double-throw switch.

As shown in FIG. 2, the input switch circuit includes transmission lines A1, B1, C1, D1, E1, F1, G1, H1, I1, J1, K1, switch components SW1A, SW2A, SW3A, SW4A, SW5A, SW6A and a grounding resistor R1. One end of A1 connects to the input IN and one end of B1 and F1, the other end of A1 connects to one end of D1, E1, H1, and SW5A; the other end of B1 connects to one end of C1, J1 and SW4A; the other end of F1 connects to one end of G1 and SW6A; the other end of G1 connects to the other end of J1 and the input of PA1; the other end of C1 connects to the other end of D1 and one end of K1 and SW3A; the other end of E1 connects to one end of R1 and SW1A; the other end of H1 connects to one end of I1 and SW2A; the other end of I1 connects to the other end of K1 and the input of PA; the other end of SW1A, SW2A, SW3A, SW4A, SW5A, SW6A, and R1 connects to the ground, respectively.

The above output switch circuit includes transmission lines A2, B2, C2, D2, E2, F2, G2, H2, I2, J2, K2, switch components SW1B, SW2B, SW3B, SW4B, SW5B, SW6B and a grounding resistor R2. One end of A2 connects to the output OUT, and one end of B2 and F2; the other end of A2 connects to one end of D2, E2, H2, SW5B; the other end of B2 connects to one end of C2, J2, SW4B; the other end of F2 connects to one end of G2, SW6B; the other end of G2 connects to the other end of J2 and the output of PA; the other end of C2 connects to the other end of D2, K2, SW3B; the other end of E2 connects to R2, SW1B; the other end of H2 connects to I2, SW2B; the other end of I2 connects to the other end of K2 and the output of PA1; the other end of SW1B, SW2B, SW3B, SW4B, SW5B, SW6B, R2 connects to the ground, respectively.

The electrical length of all the transmission lines mentioned above is ¼ waveguide wavelength, the characteristic impedance of the transmission lines A1, C1, E1, F1, G1, H1, I1, J1, K1, A2, C2, E2, F2, G2, H2, I2, J2, K2 is Z0, and the characteristic impedance of the transmission lines B1, D1, B2, D2 is $Z0/\sqrt{2}$, where Z0 is 50Ω, and the resistance of R1 as well as R2 is 50Ω.

In other words, there is a transmission line with the characteristic impedance of Z0 between SW1A and SW5A, SW2A and SW5A, SW2A and PA, SW3A and SW4A, SW3A and PA, SW4A and PA1, SW5A and IN, SW6A and IN, SW6A and PA1, SW1B and SW5B, SW2B and SW5B, SW2B and PA1, SW3B and SW4B, SW3B and PA1, SW4B and PA, SW5B and OUT, SW6B and OUT, SW6B and PA, respectively; there is a transmission line with the characteristic impedance of $Z0/\sqrt{2}$ between SW3A and SW5A, SW4A and IN, SW3B and SW5B, SW4B and OUT, respectively.

According to the above structure, the power amplifier system in the first embodiment can work in the way as follows:

Connect SW1A, SW2A, SW3A, SW4A, SW5A, and SW1B, SW3B, SW4B, SW6B and disconnect SW6A and SW2B, SW5B. The signals are inputted from IN, transmitted through the transmission lines F1 and G1, amplified by the power amplifier PA1, and transmitted through the transmission lines I2, H2, A2 before being outputted from OUT. The work state of the system at this time is normal, with the power amplifier PA1 working and the standby power amplifier PA being idle. Different from the existing solution, in which each power amplifier amplifies the input signal, only PA1 in this embodiment of the present invention amplifies the input signal in normal work state, while PA is not involved, thus reducing the consistency requirement on the power amplifiers.

Connect SW1A, SW3A, SW4A, SW6A and SW1B, SW2B, SW3B, SW4B, SW5B, disconnect SW2A, SW5A and SW6B. The signals are inputted from IN, transmitted through the transmission lines A1, H1, I1, amplified by the power amplifier PA, then transmitted through the transmission line G2, F2 before being outputted from OUT. The system works in a standby state now, with the standby power amplifier PA working and the power amplifier PA1 being idle.

Connect SW2A, SW6A, SW2B, SW6B, disconnect SW1A, SW3A SW4A, SW5A and SW1B, SW3B, SW4B, SW5B. The signals are inputted from IN, transmitted through the input switch circuit and divided into 2 groups before being amplified by the power amplifiers PA1 and PA2, and the two groups of signals are then combined by the output switch circuit before being outputted from OUT. The system works in a concurring state at this time, with the power amplifier PA1 and the standby power amplifier PA working together.

The Second Embodiment

While the 1+1 standby and concurring power amplifier system is given in the first embodiment, a 3+1 standby and concurring power amplifier system will be given in the second embodiment of the invention. "3+1" means there are 3 main power amplifiers and 1 standby power amplifier in the system.

Figure 3:
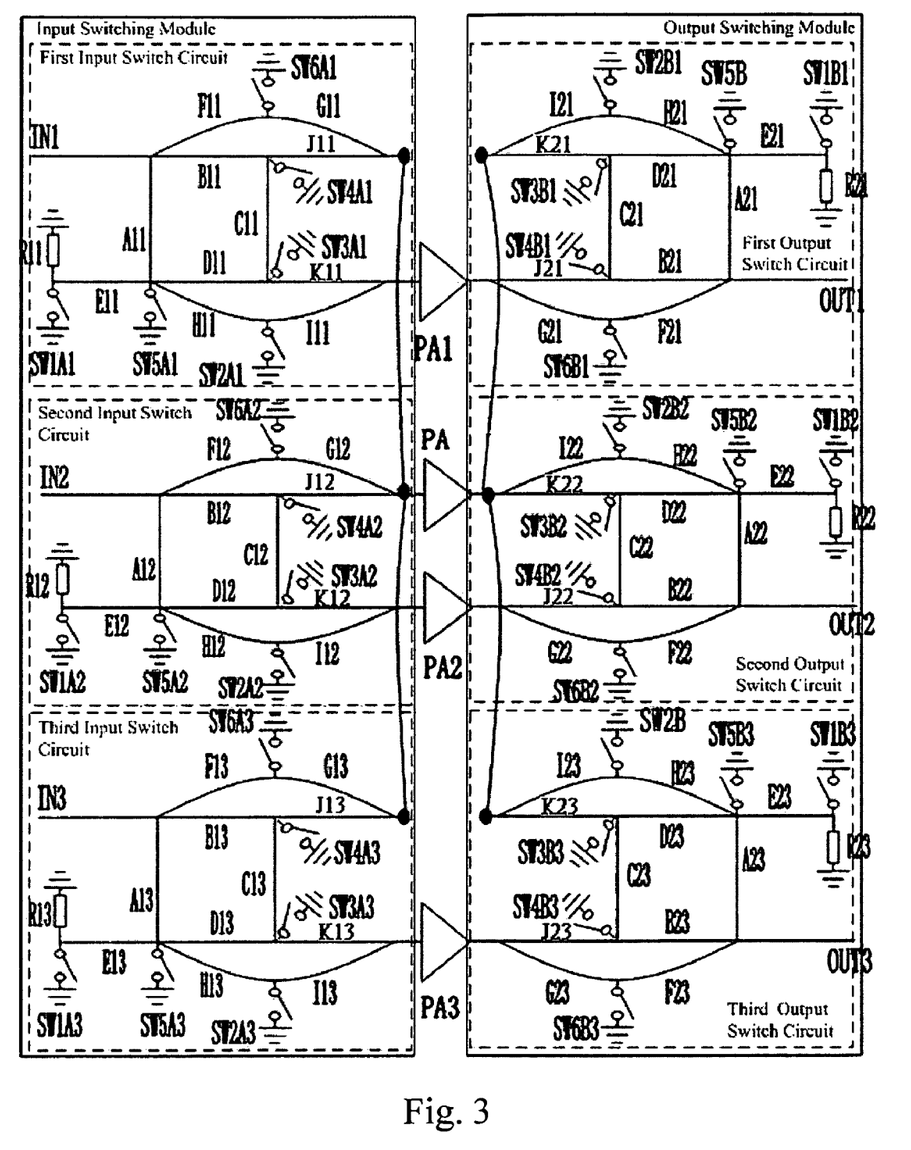
FIG. 3 is a schematic diagram of a 3+1 standby and concurring power amplifier system in accordance with a second embodiment of the present invention.

As shown in FIG. 3, the power amplifier system in the second embodiment includes 3 main power amplifiers PA1, PA2, PA3, a standby power amplifier PA, an input switching module and an output switching module. Since there are 3 main power amplifiers, the input switching module includes 3 input switch circuits, each of which has a function of power distribution and microwave single-pole double-throw switch; and the output switching module includes 3 output switch circuits, each of which has a function of power combination and microwave single-pole double-throw switch.

As shown in FIG. 3, PAn (n=1, 2, 3) refers to the main power amplifier PA1, PA2 or PA3. Since the main power amplifier PAn and the standby power amplifier PA are coequal, the positions of the main power amplifier and the standby power amplifier are swapped in the second embodiment compared with the first embodiment. The $n^{th}$ input switch circuit corresponding to the power amplifier PAn includes transmission lines A1n, B1n, C1n, D1n, E1n, F1n, G1n, H1n, I1n, J1n, K1n, switch components SW1An, SW2An, SW3An, SW4An, SW5An, SW6An and a grounding resistor R1n. The $n^{th}$ output switch circuit corresponding to the main power amplifier PAn includes transmission lines A2n, B2n, C2n, D2n, E2n, F2n, G2n, H2n, I2n, J2n, K2n, switch components SW1Bn, SW2Bn, SW3Bn, SW4Bn, SW5Bn, SW6Bn and a grounding resistor R2n.

In the $n^{th}$ input switch circuit, one end of A1n connects to one end of the input INn, B1n, F1n, the other end of A1n connects to one end of D1n, E1n, H1n, SW5An; the other end of B1n connects to one end of C1n, J1n, SW4An; the other end of F1n connects to one end of G1n, SW6An; the other end of G1n connects to the other end of J1n, the input of PA; the other end of C1n connects to the other end of D1n and one end of K1n, SW3An; the other end of E1n connects to one end of R1n, SW1An; the other end of H1n connects to I1n, SW2An; the other end of I1n connects to the other end of K1n and the input of PAn; the other end of SW1An, SW2An, SW3An, SW4An, SW5An, SW6An, R1n connects to the ground, respectively.

In the $n^{th}$ output switch circuit, one end of A2n connects to one end of the output OUTn, B2n, F2n, the other end of A2n connects to one end of D2n, E2n, H2n, SW5Bn; the other end of B2n connects to one end of C2n, J2n, SW4Bn; the other end of F2n connects to one end of G2n, SW6Bn; the other end of G2n connects to the other end of J2n and the output of PAn; the other end of C2n connects to the other end of D2n and one end of K2n, SW3Bn; the other end of E2n connects to one end of R2n, SW1Bn; the other end of H2n connects to one end of I2n, SW2Bn; the other end of I2n connects to the other end of K2n and the output of PA; the other end of SW1Bn, SW2Bn, SW3Bn, SW4Bn, SW5Bn, SW6Bn, R2n connects to the ground, respectively.

The electrical length of the transmissions lines mentioned in the second embodiment is ¼ waveguide wavelength, the characteristic impedance of the transmission lines A1n, C1n, E1n, F1n, G1n, H1n, I1n, J1n, K1n, A2n, C2n, E2n, F2n, G2n, H2n, I2n, J2n, K2n is Z0, the characteristic impedance of the transmission lines B1n, D1n, B2n, D2n is $Z0/\sqrt{2}$, where Z0 is 50Ω, and the resistance of R1n as well as R2n is 50Ω.

According to the structure described above, the power amplifier system in the second embodiment can work in the way as follows:

Connect SW1An, SW3An, SW4An, SW6An and SW1Bn, SW2Bn, SW3Bn, SW4Bn, SW5Bn, disconnect SW2An, SW5An and SW6Bn. The signals are inputted from INn, transmitted through the transmission lines A1n, H1n, I1n, amplified by the power amplifier PAn, and transmitted through the transmission lines G2n, F2n before being outputted from OUTn. The system works in the normal state at this time, with the main power amplifier PAn working and the standby power amplifier PA being idle. Different from the existing solution, in which each power amplifier amplifies every group of signals, each power amplifier in this embodiment amplifies just one signal, and each signal can only be amplified by one power amplifier, thus reducing the consistency requirement on the power amplifiers.

Connect SW1An, SW2An, SW3An, SW4An, SW5An and SW1Bn, SW3Bn, SW4Bn, SW6Bn, disconnect SW6An and SW2Bn, SW5Bn. The signals are inputted from INn, transmitted through the transmission lines F1n, G1n, amplified by power amplifier PAn, and transmitted through the transmission lines I2n, H2n, A2n before being outputted from OUTn. The work state of the system at this time is standby, with the standby power amplifier PA working and the power amplifier PAn being idle. Likewise, it is different from the existing solution, in which each power amplifier amplifies every group of signals, that each power amplifier in this embodiment amplifies only one signal, and each signal can only be amplified by one power amplifier, thus reducing the consistency requirement on the power amplifiers.

Connect SW2An, SW6An and SW2Bn, SW6Bn, disconnect SW1An, SW3An, SW4An, SW5An and SW1Bn, SW3Bn, SW4Bn, SW5Bn. The signals are inputted from INn, transmitted through the input switch circuit and divided into two groups, which then are transmitted through PAn and PA, amplified by power amplifier PAn and PA and then combined by the output switch circuit before being outputted from OUT. The system at this time works in the PA & PAn concurring state, with the power amplifier PAn and the standby power amplifier PA working together to amplify the signals amplified in the normal work state by the power amplifier PAn. Different from the existing solution, in which each power amplifier amplifies every group of signals, each power amplifier in this embodiment amplifies just one group of signal, and only the group of signals amplified by PA and PAn are the signals amplified by two power amplifiers while the other groups of signals are amplified by only one power amplifier. Thus, different from the existing solution, in which the requirement on consistency of all the power amplifiers has to be met, it is only needed to meet the requirement on consistency of PA and Pan in the embodiment. Therefore, the consistency requirement on the power amplifiers could be greatly reduced.

It should be noted that both the standby function and the concurring function are implemented here only for one main power amplifier, with all the other main power amplifiers still working in normal state. In this way, it is ensured that there is no correlation between the isolation of sectors and the consistency of the power amplifiers.

For instance, when the standby is configured with the power amplifier PA1, connect SW1A1, SW2A1, SW3A1, SW4A1, SW5A1 and SW1B1, SW3B1, SW4B1, SW6B1, disconnect SW6A1 and SW2B1, SW5B1 in the first input switch circuit and the first output switch circuit; and connect SW1A2, SW3A2, SW4A2, SW6A2, SW1B2, SW2B2, SW3B2, SW4B2, SW5B2, SW1A3, SW3A3, SW4A3, SW6A3, SW1B3, SW2B3, SW3B3, SW4B3, SW5B3, disconnect SW2A2, SW5A2, SW6B2, SW2A3, SW5A3 and SW6B3 in the second input switch circuit, the second output switch circuit, the third input switch circuit and the third output switch circuit. In this case, PA1 is not working, PA2, PA3 and PA are working, and the signals being amplified by the standby power amplifier PA are the signals amplified by PA1 in the normal state.

For another instance, when the PA and PA1 are concurring, connect SW2A1, SW6A1 and SW2B1, SW6B1, disconnect SW1A1, SW3A1, SW4A1, SW5A1 and SW1B1, SW3B1, SW4B1, SW5B1; and in the second input switch circuit, the second output switch circuit, the third input switch circuit and the third output switch circuit, connect SW1A2, SW3A2, SW4A2, SW6A2, SW1B2, SW2B2, SW3B2, SW4B2, SW5B2, SW1A3, SW3A3, SW4A3, SW6A3, SW1B3, SW2B3, SW3B3, SW4B3, SW5B3, disconnect SW2A2, SW5A2, SW6B2, SW2A3, SW5A3 and SW6B3. In this case, PA1, PA2, PA3 and PA are working. PA1 and PA are in the parallel connection to amplify the signals amplified by PA1 in the normal state while PA2 and PA3 are working in the normal state.

The Third Embodiment

Compared with the first and the second embodiment, different structures of the input switch circuit and the output switch circuit are proposed in the third embodiment of the invention. The system is to be described in this embodiment by a 1+1 standby and concurring system.

Figure 4:
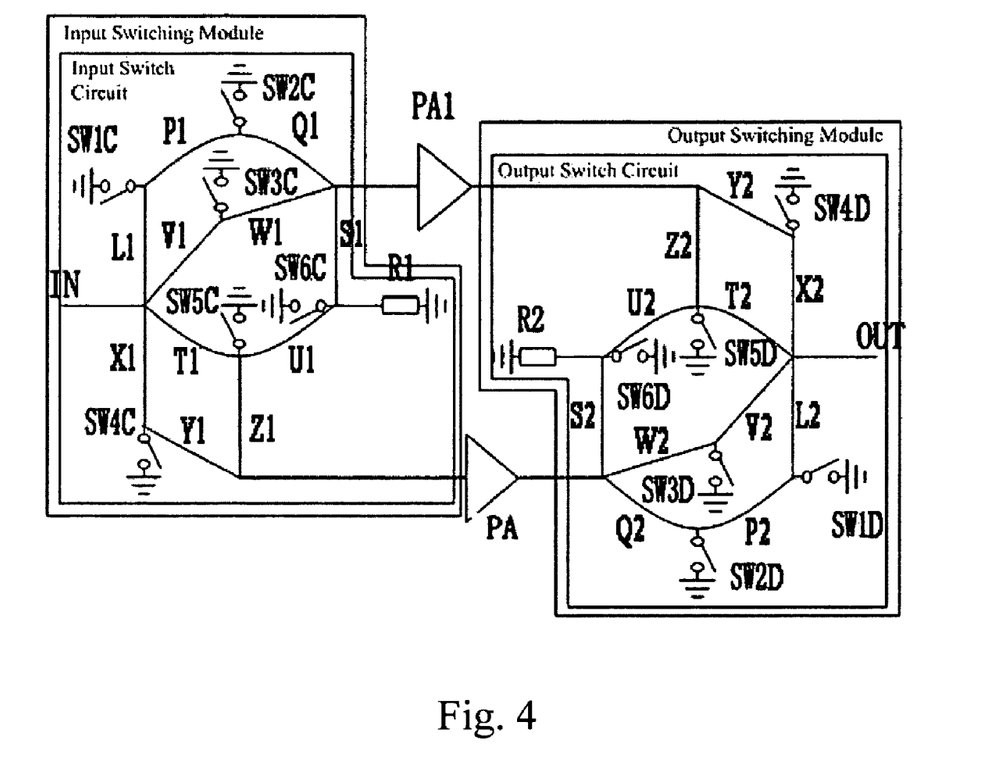
FIG. 4 is a schematic diagram of a 1+1 standby and concurring power amplifier system in accordance with a third embodiment of the present invention.

As shown in FIG. 4, the power amplifier system in the third embodiment includes a main power amplifier PA1, a standby power amplifier PA, an input switching module and an output switching module. Since there is only one main power amplifier, the input switching module includes one input switch circuit, and the output switching module includes one output switch circuit. The aforesaid input switch circuit has a function of power distribution and microwave single-pole double-throw switch, and the output switch circuit has a function of power combination and microwave single-pole double-throw switch.

As shown in FIG. 4, the input switch circuit in the third embodiment includes transmission lines L1, P1, Q1, S1, T1, U1, V1, W1, X1, Y1, Z1, switch components SW1C, SW2C, SW3C, SW4C, SW5C, SW6C and a grounding resistor R1. One end of L1 connects to one end of the input IN, X1, T1, V1, while the other end of L1 connects to one end of P1, SW1C; the other end of P1 connects to one end of Q1, SW2C; the other end of Q1 connects to one end of S1, W1 and the input of PA1; the other end of S1 connects to one end of U1, SW6C, R1; the other end of T1 connects to the other end of U1, and one end of Z1, SW5C; the other end of X1 connects to one end of Y1, SW4C; the other end of Y1 connects to the other end of Z1, and the input of PA; the other end of V1 connects to the other end of W1, and one end of SW3C; the other end of SW1C, SW2C, SW3C, SW4C, SW5C, SW6C, R1 connects to the ground, respectively.

The output switch circuit in the third embodiment includes transmission lines L2, P2, Q2, S2, T2, U2, V2, W2, X2, Y2, Z2, switch components SW1D, SW2D, SW3D, SW4D, SW5D, SW6D and a grounding resistor R2. One end of L2 connects to one end of the output OUT, X2, T2, V2, the other end of L2 connects to one end of P2, SW1D; the other end of P2 connects to one end of Q2, SW2D; the other end of Q2 connects to one end of S2, W2, and the output of PA; the other end of S2 connects to one end of U2, SW6D, R2; the other end of T2 connects to the other end of U2 and one end of Z2, SW5D; the other end of X2 connects to one end of Y2, SW4D; the other end of Y2 connects to the other end of Z2 and the output of PA1; the other end of V2 connects to the other end of W2 and one end of SW3D; the other end of SW1D, SW2D, SW3D, SW4D, SW5D, SW6D, R2 connects to the ground, respectively.

The electrical length of each of the transmission lines mentioned above is ¼ waveguide wavelength, the characteristic impedance of the transmission lines L1, P1, Q1, S1, T1, U1, L2, P2, Q2, S2, T2, U2 is $\sqrt{2}Z0$, the characteristic impedance of transmission lines V1, W1, X1, Y1, Z1, V2, W2, X2, Y2, Z2 is Z0, wherein Z0 is 50Ω, and the resistance of R1 as well as R2 is 50Ω.

In other words, there is a transmission line with the characteristic impedance of $\sqrt{2}Z0$ between SW1C and SW2C, SW1C and IN, SW2C and PA1, SW5C and SW6C, SW5C and IN, SW6C and PA1, SW1D and SW2D, SW1D and OUT, SW2D and PA, SW5D and SW6D, SW5D and OUT, SW6D and PA, respectively; there is a transmission line with the characteristic impedance of Z0 between SW3C and IN, SW4C and IN, SW4C and PA, SW3C and PA1 SW5C and PA, SW3D and OUT, SW4D and OUT, SW4D and PA1, SW3D and PA, SW5D and PA1, respectively.

According to the system structure in the third embodiment described above, the power amplifier system can work in the way as follows:

Connect SW1C, SW2C, SW4C, SW5C, SW6C and SW1D, SW2D, SW3D, SW5D, SW6D, disconnect SW3C and SW4D. The signals are inputted from IN, transmitted through the transmission lines V1 and W1, amplified by the power amplifier PA1, and transmitted through transmission lines Y2 and X2 before being outputted from OUT. At this time, the system works in the normal state, with the power amplifier PA1 working and the standby power amplifier PA being idle. Different from the existing solution, in which each power amplifier amplifies the input signal, only PA1 in this embodiment amplifies the input signal in the normal work state, and the input signal is amplified only by PA1 while PA is not involved in amplification, thus the consistency requirement on the power amplifiers is reduced.

Connect SW1C, SW2C, SW3C, SW5C, SW6C and SW1D, SW2D, SW4D, SW5D, SW6D, disconnect SW4C and SW3D. The signals are inputted from IN, transmitted through the transmission lines X1 and Y1, amplified by the power amplifier PA, and transmitted through the transmission lines W2 and V2 before being outputted from OUT. The system at this time works in the standby state, with the standby power amplifier PA working and the power amplifier PA1 being idle.

Connect SW3C, SW4C and SW3D, SW4D, disconnect SW1C, SW2C, SW5C, SW6C and SW1D, SW2D, SW5D, SW6D. The signals are inputted from IN, divided into two groups by the input switch circuit and sent to PA1 and PA, respectively. The two groups of signals are amplified by the power amplifiers PA1 and PA, and then combined by the output switch circuit before being outputted from OUT. The system at this time works in the concurring state, with the power amplifier PA1 and the standby power amplifier PA working together.

According to the structure of the input switch circuit and the output switch circuit given in the third embodiment, and the relationship between the main power amplifier and the standby power amplifier, it is easy to deduce the structure of an N+1 standby and concurring system of power amplifier by using the input switch circuit and the output switch circuit of the third embodiment, the detailed description of which is thus omitted here. It can be appreciated by those skilled in the art that, just like the second embodiment, the consistency requirement on the power amplifiers is reduced in the N+1 standby and concurring system of power amplifier by using the input switch circuit and the output switch circuit of the third embodiment.

Furthermore, when the input switch circuit in the first embodiment is employed as the input switch circuit of the input switching module, the output switch circuit in the third embodiment can be employed as the output switch circuit of the output switching module; alternatively, when the input switch circuit in the third embodiment is employed as the input switch circuit of the input switching module, the output switch circuit in the first embodiment can be employed as the output switch circuit of the output switching module.

The descriptions above are just preferable embodiments of the present invention, and not to be used to limit the protection scope thereof. Any modifications, equivalent substitutions or improvements within the spirit and principles of the present invention should be covered by the protection scope of the present invention.

What is claimed is:

1. A power amplifier system, comprising:
   at least one main power amplifier;
   a standby power amplifier;
   an input switching module, including at least one input switch circuit which is connected to an input of the at least one main power amplifier and an input of the standby power amplifier, respectively; and the at least one input switch circuit comprises:
   a first group of transmission lines; and a first group of switch components, configured to select a plurality of transmission lines of the first group of transmission lines to enable an input signal to be inputted to the at least one main power amplifier and/or the standby power amplifier through the plurality of transmission lines of the first group of transmission lines;

an output switching module, including at least one output switch circuit which is connected to an output of the at least one main power amplifier and an output of the standby power amplifier, respectively; and the at least one output switch circuit comprises:

a second group of transmission lines; and a second group of switch components, configured to select a plurality of transmission lines of the second group of transmission lines to enable the input signal amplified by the main power amplifier and/or the standby power amplifier to be outputted through the plurality of transmission lines of the second group of transmission lines;

wherein each switch component connects to a corresponding transmission line in parallel.

2. The system according to claim 1, wherein each input switch circuit comprises a first switch component, a second switch component, a third switch component, a fourth switch component, a fifth switch component, a sixth switch component, nine first transmission lines, two second transmission lines and a first grounding resistor; the characteristic impedance of the second transmission line is $1/\sqrt{2}$ of the characteristic impedance of the first transmission line, and the electrical length of the first transmission line and the second transmission line is ¼ of waveguide wavelength;

one end of each switch component and one end of the first grounding resistor connect to the ground; the other end of the first switch component connects to the other end of the first grounding resistor; the transmission lines between the first switch component and the fifth switch component, between the second switch component and the fifth switch component, between the second switch component and the standby power amplifier, between the third switch component and the fourth switch component, between the third switch component and the standby power amplifier, between the fourth switch component and the $n^{th}$ main power amplifier, between the fifth switch component and the input of the $n^{th}$ input switch circuit, between the sixth switch component and the input of the $n^{th}$ input switch circuit, and between the sixth switch component and the $n^{th}$ main power amplifier are the first transmission lines; the transmission lines between the third switch component and the fifth switch component, and between the fourth switch component and the input of the $n^{th}$ input switch circuit are the second transmission lines;

the signal inputted to the input switch circuit is further inputted to the main power amplifier connecting to the input switch circuit by connecting the first switch component, the second switch component, the third switch component, the fourth switch component, the fifth switch component and disconnecting the sixth switch component, and the signal inputted to the input switch circuit is inputted to the standby power amplifier by connecting the first switch component, the third switch component, the fourth switch component, the sixth switch component and disconnecting the second switch component and the fifth switch component.

3. The system according to claim 1, wherein each input switch circuit comprises a first switch component, a second switch component, a third switch component, a fourth switch component, a fifth switch component, a sixth switch component, six third transmission lines, five fourth transmission lines and a third grounding resistor; the characteristic impedance of the third transmission line is $\sqrt{2}$ times of the characteristic impedance of the fourth transmission line, and the electrical length of the third transmission line and the fourth transmission line is ¼ of waveguide wavelength;

one end of each switch component and one end of the third grounding resistor connect to the ground; the other end of the sixth switch component connects to the other end of the third grounding resistor; the transmission lines between the first switch component and the second switch component, between the first switch component and the input of the $n^{th}$ input switch circuit, between the second switch component and the $n^{th}$ main power amplifier, between the fifth switch component and the sixth switch component, between the fifth switch component and the input of the $n^{th}$ input switch circuit, and between the sixth switch component and the $n^{th}$ main power amplifier are the third transmission lines; the transmission lines between the third switch component and the input of $n^{th}$ input switch circuit, between the fourth switch component and the input of the $n^{th}$ input switch circuit, between the fourth switch component and the standby power amplifier, between the third switch component and the $n^{th}$ main power amplifier, and between the fifth switch component and the standby power amplifier are the fourth transmission lines;

the signal inputted to the input switch circuit is further inputted to the main power amplifier connecting to the input switch circuit by connecting the first switch component, the second switch component, the fourth switch component, the fifth switch component, the sixth switch component and disconnecting the third switch component; and the signal inputted to the input switch circuit is inputted to the standby power amplifier by connecting the first switch component, the second switch component, the third switch component, the fifth switch component, the sixth switch component and disconnecting the fourth switch component.

4. The system according to claim 1, wherein each output switch circuit comprises a seventh switch component, an eighth switch component, a ninth switch component, a tenth switch component, an eleventh switch component, a twelfth switch component, nine first transmission lines, two second transmission lines and a second grounding resistor; the characteristic impedance of the second transmission line is $1/\sqrt{2}$ of the characteristic impedance of the first transmission line, and the electrical length of the first transmission line and the second transmission line is ¼ of waveguide wavelength;

one end of each switch component and one end of the second grounding resistor connect to the ground; the other end of the seventh switch component connects to the other end of the second grounding resistor; the transmission lines between the seventh switch component and the eleventh switch component, between the eighth switch component and the eleventh switch component, between the eighth switch component and the $n^{th}$ main power amplifier, between the ninth switch component and the tenth switch component, between the ninth switch component and the $n^{th}$ main power amplifier, between the tenth switch component and the standby power amplifier, between the eleventh switch component and the output of the $n^{th}$ output switch circuit, between the twelfth switch component and the output of the $n^{th}$ output switch circuit, and between the twelfth switch component and the standby power amplifier are the first transmission lines; the transmission lines between the ninth switch component and the eleventh switch component, and between the tenth switch component and the output of the $n^{th}$ output switch circuit are second transmission lines;

the signal amplified by the main power amplifier connecting to the output switch circuit is outputted by connecting the seventh switch component, the ninth switch component, the tenth switch component, the twelfth switch component and disconnecting the eighth switch component and the eleventh switch component; and the signal amplified by the standby power amplifier is outputted by connecting the seventh switch component, the eighth switch component, the ninth switch component, the tenth switch component, the eleventh switch component and disconnecting the twelfth switch component.

5. The system according to claim 1, wherein each output switch circuit comprises a seventh switch component, an eighth switch component, a ninth switch component, a tenth switch component, an eleventh switch component, a twelfth switch component, six third transmission lines, five fourth transmission lines and a fourth grounding resistor; the characteristic impedance of the third transmission line is $\sqrt{2}$ times of the characteristic impedance of the fourth transmission line, and the electrical length of the third transmission line and the fourth transmission line is ¼ of waveguide wavelength;

one end of each switch component and one end of the fourth grounding resistor connect to the ground; the other end of the twelfth switch component connects to the other end of the fourth grounding resistor; the transmission lines between the seventh switch component and the eighth switch component, between the seventh switch component and the output of the $n^{th}$ output switch circuit, between the eighth switch component and the standby power amplifier, between the eleventh switch component and the twelfth switch component, between the eleventh switch component and the output of the $n^{th}$ output switch circuit, and between the twelfth switch component and the standby power amplifier are the third transmission lines; the transmission lines between the ninth switch component and the output of the $n^{th}$ output switch circuit, between the tenth switch component and the output of the $n^{th}$ output switch circuit, between the tenth switch component and the $n^{th}$ main power amplifier, between the ninth switch component and the standby power amplifier, and between the eleventh switch component and the $n^{th}$ main power amplifier are the fourth transmission lines;

the signal amplified by the main power amplifier connecting to the output switch circuit is outputted by connecting the seventh switch component, the eighth switch component, the ninth switch component, the eleventh switch component, the twelfth switch component and disconnecting the tenth switch component; and the signal amplified by the standby power amplifier is outputted by connecting the seventh switch component, the eighth switch component, the tenth switch component, the eleventh switch component and the twelfth switch component, and disconnecting the ninth switch component.

6. The system according to claim 2, wherein each output switch circuit comprises a seventh switch component, an eighth switch component, a ninth switch component, a tenth switch component, an eleventh switch component, a twelfth switch component, nine first transmission lines, two second transmission lines and a second grounding resistor; the characteristic impedance of the second transmission line is $1/\sqrt{2}$ of the characteristic impedance of the first transmission line, and the electrical length of the first transmission line and the second transmission line is ¼ of waveguide wavelength;

one end of each switch component and one end of the second grounding resistor connect to the ground; the other end of the seventh switch component connects to the other end of the second grounding resistor; the transmission lines between the seventh switch component and the eleventh switch component, between the eighth switch component and the eleventh switch component, between the eighth switch component and the $n^{th}$ main power amplifier, between the ninth switch component and the tenth switch component, between the ninth switch component and the $n^{th}$ main power amplifier, between the tenth switch component and the standby power amplifier, between the eleventh switch component and the output of the $n^{th}$ output switch circuit, between the twelfth switch component and the output of the $n^{th}$ output switch circuit, and between the twelfth switch component and the standby power amplifier are the first transmission lines; the transmission lines between the ninth switch component and the eleventh switch component, and between the tenth switch component and the output of the $n^{th}$ output switch circuit are second transmission lines;

the signal amplified by the main power amplifier connecting to the output switch circuit is outputted by connecting the seventh switch component, the ninth switch component, the tenth switch component, the twelfth switch component and disconnecting the eighth switch component and the eleventh switch component; and the signal amplified by the standby power amplifier is outputted by connecting the seventh switch component, the eighth switch component, the ninth switch component, the tenth switch component, the eleventh switch component and disconnecting the twelfth switch component.

7. The system according to claim 3, wherein each output switch circuit comprises a seventh switch component, an eighth switch component, a ninth switch component, a tenth switch component, an eleventh switch component, a twelfth switch component, six third transmission lines, five fourth transmission lines and a fourth grounding resistor; the characteristic impedance of the third transmission line is $\sqrt{2}$ times of the characteristic impedance of the fourth transmission line, and the electrical length of the third transmission line and the fourth transmission line is ¼ of waveguide wavelength;

one end of each switch component and one end of the fourth grounding resistor connect to the ground; the other end of the twelfth switch component connects to the other end of the fourth grounding resistor; the transmission lines between the seventh switch component and the eighth switch component, between the seventh switch component and the output of the $n^{th}$ output switch circuit, between the eighth switch component and the standby power amplifier, between the eleventh switch component and the twelfth switch component, between the eleventh switch component and the output of the $n^{th}$ output switch circuit, and between the twelfth switch component and the standby power amplifier are the third transmission lines; the transmission lines between the ninth switch component and the output of the $n^{th}$ output switch circuit, between the tenth switch component and the output of the $n^{th}$ output switch circuit, between the tenth switch component and the $n^{th}$ main power amplifier, between the ninth switch component and the standby power amplifier, and between the eleventh switch component and the n$^{th}$ main power amplifier are the fourth transmission lines;

the signal amplified by the main power amplifier connecting to the output switch circuit is outputted by connecting the seventh switch component, the eighth switch component, the ninth switch component, the eleventh switch component, the twelfth switch component and disconnecting the tenth switch component; and the signal amplified by the standby power amplifier is outputted by connecting the seventh switch component, the eighth switch component, the tenth switch component, the eleventh switch component and the twelfth switch component, and disconnecting the ninth switch component.

8. A method for power amplifying, applied in a system comprising at least one main power amplifier; a standby power amplifier; an input switching module including at least one input switch circuit which is connected to an input of the at least one main power amplifier and an input of the standby power amplifier, wherein the at least one input switch circuit comprises a first group of transmission lines and a first group of switch components; and an output switching module including at least one output switch circuit which is connected to an output of the at least one main power amplifier and an output of the standby power amplifier, wherein the at least one output switch circuit comprises a second group of transmission lines and a second group of switch component; wherein each switch component connects a corresponding transmission line in parallel;

the method comprising:

when the at least one main power amplifier works normally, disconnecting a first set of the first group of switch components and connecting the other of the first group of switch components to select a plurality of transmission lines of the first group of transmission lines to form a first signal path to enable an input signal to be inputted to the at least one main power amplifier through the first signal path; and disconnecting a second set of the second group of switch components and connecting the other of the second group of switch components to select a plurality of transmission lines of the second group of transmission lines to form a second signal path to enable the input signal amplified by the main power amplifier to be outputted through the second signal path;

when the at least one main power amplifier fails, disconnecting a third set of the first group of switch components and connecting the other of the first group of switch components to select a plurality of transmission lines of the first group of transmission lines to form a third signal path to enable an input signal to be inputted to the standby power amplifier through the third signal path; and disconnecting a fourth set of the second group of switch components and connecting the other of the second group of switch components to select a plurality of transmission lines of the second group of transmission lines to form a fourth signal path to enable the input signal amplified by the standby power amplifier to be outputted through the fourth signal path.

9. The method of claim 8, further comprising:

when the at least main power amplifier works in parallel with the standby power amplifier, disconnecting a fifth set of the first group of switch components and connecting the other of the first group of switch components to select a plurality of transmission lines of the first group of transmission lines to form a fifth signal path and a sixth signal path, and an input signal is divided into two signals, and the two signals are respectively transmitted through the fifth signal path and the sixth signal path respectively to the inputs of the main power amplifier and the standby power amplifier;

disconnecting a sixth set of the second group of switch components and connecting the other of the second group of switch components to select a plurality of the transmission lines of the second group of transmission lines to form a seventh signal path and a eighth signal path, and the two signals respectively amplified by the main power amplifier and the standby power amplifier are respectively transmitted through the seventh signal path and the eighth signal path.

* * * * *

UNITED STATES PATENT AND TRADEMARK OFFICE
CERTIFICATE OF CORRECTION

| | | |
|---|---|---|
| PATENT NO. | : 7,514,995 B2 | Page 1 of 1 |
| APPLICATION NO. | : 11/608484 | |
| DATED | : April 7, 2009 | |
| INVENTOR(S) | : Wenxin Yuan | |

It is certified that error appears in the above-identified patent and that said Letters Patent is hereby corrected as shown below:

On the title page:

Item [57], Abstract. Line 14 "amplifies" should be --amplifier--.

Signed and Sealed this
Third Day of January, 2012

David J. Kappos
*Director of the United States Patent and Trademark Office*